(12) United States Patent
Yata et al.

(10) Patent No.: US 6,534,459 B1
(45) Date of Patent: Mar. 18, 2003

(54) RESIST RESIDUE REMOVER

(75) Inventors: Takashi Yata, Saitama (JP); Shigeki Terayama, Kyoto (JP); Yutaka Koinuma, Ibaraki (JP); Takeru Ohgushi, Chiba (JP)

(73) Assignee: Kishimoto Sangyo Co., Ltd., Osaka (JP)

( * ) Notice: Subject to any disclaimer, the term of this patent is extended or adjusted under 35 U.S.C. 154(b) by 0 days.

(21) Appl. No.: 09/635,487

(22) Filed: Aug. 9, 2000

Related U.S. Application Data

(63) Continuation of application No. PCT/JP99/06915, filed on Dec. 9, 1999.

(30) Foreign Application Priority Data

Dec. 9, 1998 (JP) .............................. 10-368536
Nov. 25, 1999 (JP) .............................. 11-334202

(51) Int. Cl.$^7$ ................................................ G03F 7/32
(52) U.S. Cl. ......................................... 510/176; 430/331
(58) Field of Search ............................ 510/176; 430/331

(56) References Cited

U.S. PATENT DOCUMENTS

| | | | |
|---|---|---|---|
| 3,474,021 A | 10/1969 | Davidse et al. | 204/192.32 |
| 3,497,407 A | 2/1970 | Esch et al. | 438/756 |
| 3,891,438 A * | 6/1975 | Katz et al. | 430/331 |
| 4,043,811 A * | 8/1977 | Pratt | 101/465 |
| 4,155,738 A * | 5/1979 | Boghosian | 252/186.26 |
| 4,258,122 A * | 3/1981 | Uchida et al. | 101/455 |
| 4,381,340 A * | 4/1983 | Walls | 430/331 |
| 4,454,043 A * | 6/1984 | Ting et al. | 210/198.2 |
| 4,613,561 A * | 9/1986 | Lewis | 430/331 |
| 5,126,265 A * | 6/1992 | Cidaria et al. | 424/116 |
| 5,292,626 A | 3/1994 | Buhr et al. | 430/331 |
| 5,985,525 A | 11/1999 | Sato et al. | 430/331 |
| 6,121,152 A * | 9/2000 | Adams et al. | 216/86 |

FOREIGN PATENT DOCUMENTS

| | | |
|---|---|---|
| JP | 57-024540 | 2/1982 |
| JP | 60177185 * | 9/1985 |
| JP | 64-15740 | 1/1989 |
| JP | 6-118660 | 4/1994 |
| WO | WO 98/45399 | 10/1998 |
| WO | WO 99/44101 | 9/1999 |

* cited by examiner

*Primary Examiner*—Hoa Van Le
(74) *Attorney, Agent, or Firm*—Oblon, Spivak, McClelland, Maier & Neustadt, P.C.

(57) ABSTRACT

The invention provides a nontoxic, undangerous resist residue remover that enables removal of resist residues to be carried out without metal corrosion or other problems and with safety. The remover is an aqueous solution containing ammonium phosphate and/or condensed ammonium phosphate and having a pH ranging from 1 to 10.

27 Claims, 1 Drawing Sheet

RESIST RESIDUE REMOVER

This application is a Continuation of international PCT application No. PCT/JP99/06915, filed on Dec. 9, 1999, pending.

BACKGROUND OF THE INVENTION

1. Field of the Invention

The present invention relates generally to a resist residue remover for removal of resist residues occurring in semiconductor device or liquid crystal device fabrication processes. More specifically, this invention is directed to a resist residue remover used for removal of resist and other residues which occur in a process wherein a photoresist is coated on an electrically conductive metal or insulating film formed on a substrate, and exposed to light and developed to form a resist pattern thereon, and this resist pattern is used as a mask to selectively etch the metal or insulating film or implant ions for circuit formation, and an unnecessary portion of the resist is removed by ashing. According to the invention, such residues can be removed without any corrosion of the conductive or insulating film.

2. Description of the Background

For removal of resist residues in fabrication processes of semiconductor devices such as those of silicon and compounds such as GaAs and liquid crystal devices (LCDs), compositions comprising a main component mixed with an organic solvent, etc. have so far been used, said main component being selected from strong acids such as hydrochloric acid, sulfuric acid and nitric acid; hydrogen peroxide; ammonia; fluorides such as hydrofluoric acid and ammonium fluoride; and amines and hydrazines such as hydroxylamine, hydrazine and monoethanolamine.

All these compositions are hazardous chemicals or contain large amounts of dangerous materials such as organic solvents. With environmental protection in mind, therefore, some considerable protection measures are needed to secure safety, and carry out waste disposal, in semiconductor fabrication processes.

That is, remover compositions composed mainly of ammonium fluoride, which is in itself a terrible chemical, are used upon diluted with organic solvents such as N-methylpyrrolidone and dimethylformamide that are dangerous materials. Also, hydroxylamine, tetramethylammonium hydroxide, monoethanolamine, etc. are in themselves organic materials or used in the form of compositions with other organic materials.

In semiconductor fabrication processes using such compositions as those containing large amounts of organic materials that are terrible chemicals or dangerous materials, therefore, some considerable safeguards are required for the purposes of securing the safety of work, and environmental protection.

For compositions containing much organic materials, the step for removal of resist residues must be followed by a rinsing step wherein rinsing must be carried out using a water-soluble organic solvent such as isopropyl alcohol, and N-methylpyrrolidone. However, this organic solvent is a dangerous material for which some safeguards or environmental protection measures are needed.

On the other hand, metals such as tungsten and titanium are now increasingly used for gate structures. However, this offers a problem in that a sulfuric acid aqueous solution of hydrogen peroxide (SPM) or an ammonia aqueous solution of hydrogen peroxide (APM) available for removal of resist residues cannot be used because of corroding the metals, resulting in breakdowns of the gate structures. With removers composed mainly of amines, on the other hand, it is difficult to remove resist residues that remain after ion implantation etching using phosphorus, arsenic, boron and other ions.

SUMMARY OF THE INVENTION

An object of the present invention is to provide a resist residue remover which enables resist residues occurring in semiconductor or liquid crystal fabrication processes, i.e., metal component-containing residues or implanted ion-containing resist portions remaining after dry etching to be removed without any corrosion of interconnecting wires or gate metals.

This object is achievable by the inventions recited hereinbelow.

(1) A resist residue remover which comprises an aqueous solution containing ammonium phosphate and/or condensed ammonium phosphate and having a pH ranging from 1 to 10.

(2) The resist residue remover according to (1) above, wherein said ammonium phosphate and/or said condensed ammonium phosphate have a concentration of 20% by mass or less as expressed in terms of total phosphorus concentration.

(3) The resist residue remover according to (1) or (2) above, wherein said condensed ammonium phosphate contains ammonium polyphosphate in which a polymerization degree thereof is n=2, 3, 4 or 5 and/or ammonium metaphosphate in which a polymerization degree thereof is n=3, 4 or 5.

(4) The resist residue remover according to any one of (1) to (3) above, wherein said pH is adjusted using at least one compound selected from phosphoric acid, condensed phosphoric acid and ammonia.

(5) The resist residue remover according to any one of (1) to (4) above, which further contains a surface active agent and/or a chelating agent.

DETAILED DESCRIPTION OF THE PREFERRED EMBODIMENTS

Figure 1:
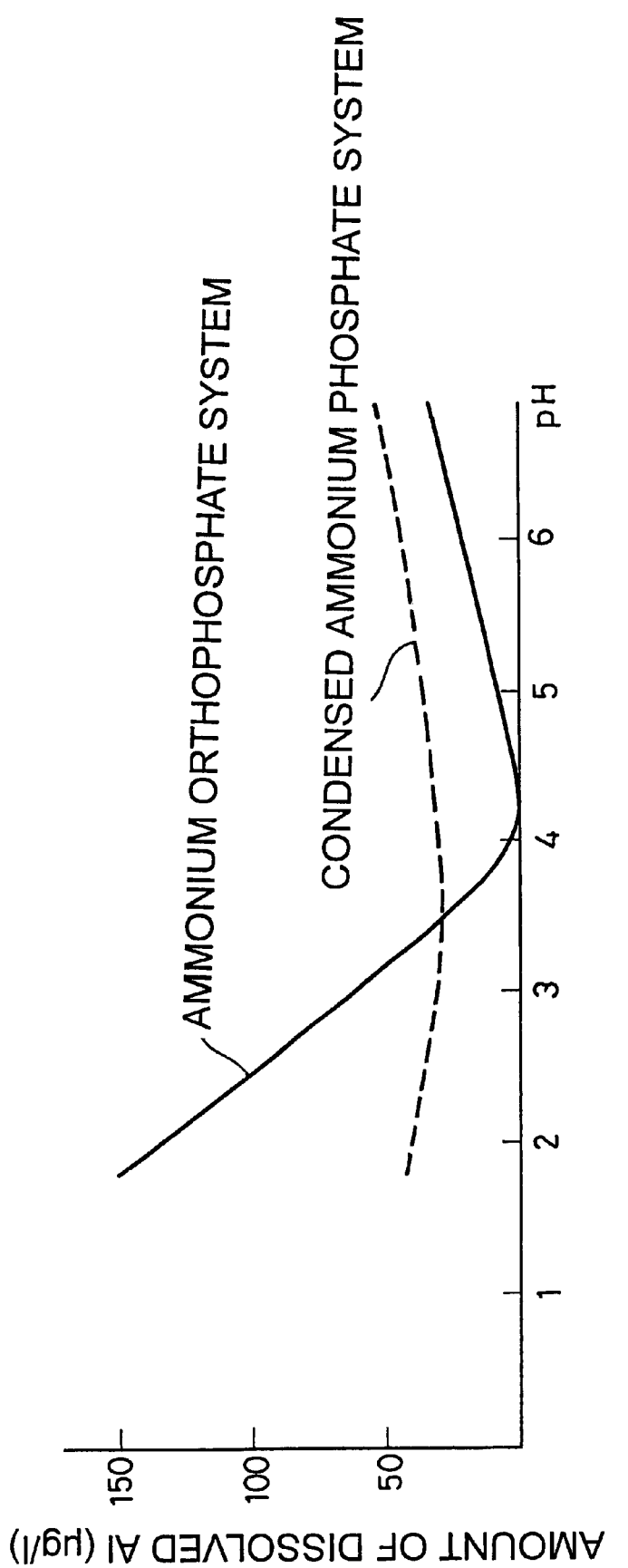
FIG. 1 is a graph illustrative of the remover composition vs. amount of dissolved aluminum relationship.

The present invention is now explained in detail.

The resist residue remover of the present invention is provided for removal of resist residues occurring in ion implantation, dry etching and ashing in the process of fabricating semiconductor devices, and liquid crystal devices (LCDs), and comprises an aqueous solution containing ammonium phosphate and/or condensed ammonium phosphate and having a pH ranging from 1 to 10.

In resist residues occurring by ion implantation and dry etching, inorganic nature is added to an organic resist film. The resist residues change to oxide-containing substances, for instance, upon treated with oxygen plasma ashing for resist removal or the like. Substances herein referred to as polymers are also included in the resist residues.

Such a remover is an aqueous solution containing ammonium phosphate and condensed ammonium phosphate, and is free from any hazardous chemical or toxic material and does not belong to a dangerous material. Thus, the remover is safe and so preferable in view of work-site environments and safety. In addition, the remover enables liquid waste disposal to be simplified because it does not contain a large amount of organic material.

For use, only contact of the remover of the present invention with the member to be treated is needed without recourse to complicated steps. In addition, the required post-treatment step comprises water washing alone. Thus, the treating operation involved can be simplified. Furthermore, the remover of the invention does not present any corrosion problem because it is unlikely to remain in the member to treated, for instance, a metal.

The ammonium phosphate used in the remover of the present invention is an ammonium salt of orthophosphoric acid ($H_3PO_4$), which may include an acidic salt in addition to a neutral salt.

The condensed ammonium phosphate may be either a polyphosphate represented by $M_{n+2}P_nO_{3n+1}$ where M is $NH_4$ and n is an integer of 2 or greater or a metaphosphate represented by $(MPO_3)_n$ where M is $NH_4$ and n is an integer of 3 or greater. In some cases, the condensed ammonium phosphate may include a salt called an ultraphosphate. It is acceptable that a part of these condensed phosphates may be present in an acidic salt form.

Generally in the remover of the present invention, the condensed phosphate is a mixture of such phosphates as mentioned above and further contains an orthophosphate. In this case, the degree of polymerization represented by n appears to be n=2 to 12 for polyphosphates and n=3 to 14 for metaphosphates. Of these phosphates, polyphosphates where n is equal to about 2 to 5 and metaphosphates where n is equal to about 3 to 5 are thought of as being preferable for the step of resist residue removal.

The concentration of the aforesaid phosphoric acid compounds inclusive of ammonium orthophosphate in such a remover should preferably be 20% by mass or less as represented in terms of total phosphorus concentration. Usually, however, that concentration should more preferably be in the range of 0.1% by mass to 10% by mass.

When the condensed ammonium phosphate is used in such a remover, the polyphosphates (n=2 to 5) and metaphosphates (n=3 to 5) thought of as being preferable for the aforesaid removal step, other than orthophosphate, should preferably account for 60% by mass or less of the phosphoric acid compounds as represented in terms of phosphorus concentration. Usually, however, they should more preferably account for 0.1% by mass to 60% by mass of the phosphoric acid compounds. At such concentrations, the remover is well capable of removing resist residues. By use of such condensed phosphates as mentioned above, the member to be treated can be protected against corrosion. Moreover, the tolerance of pH with respect to corrosion can be increased.

It is here understood that when the remover is used for a substrate which, for instance, includes metal layers such as Si/Ti/TiN/Al/TiN, the aforesaid phosphoric acid compounds should preferably have a concentration of 0.1 to 5% by mass as represented in terms of total phosphorus concentration. This enables the metal corrosion problem to be mitigated, and is preferable for liquid waste disposal-site environments, etc. Such amounts allow a metal layer having a line width of the order of submicrons, for instance, 0.1 $\mu$m inclusive to 1 $\mu$m exclusive to be effectively prevented from erosion.

When the resist residue remover is used for a substrate or film which includes no metal layer and in which the influence of the remover on metals is limited, e.g., a silicon wafer or glass substrate, the concentration of the aforesaid phosphoric acid compounds should preferably be between 1% by mass and 10% by mass as represented in terms of total phosphorus concentration.

The pH of the remover of the present invention may be selected from within the pH range of 1 to 10 depending on what purpose it is used for, etc. For pH control, orthophosphoric acid, condensed phosphoric acid or ammonia may be used. If these are used for pH control, it is then possible to enhance the ability of the remover to remove resist residues depending on their types, and reduce metal corrosion and gain temperature and time controls at the removal step. Generally, the ability of the remover to remove resist residues increases with decreasing pH.

Surface active agents, and chelating agents may be added to the remover of the present invention. Particular preference is given to the addition of surfactants. For the surfactants, commercially available nonionic, cationic, anionic and amphoteric surfactants may be all used in the invention. For instance, the nonionic surfactants usable herein include polyoxyethylene and amine oxide surfactants; the cationic surfactants include alkyltrimethyl ammonium salt surfactants; the anionic surfactants include alkyl carboxylate surfactants; and the amphoteric surfactants include betaine surfactants. Compounds of alkyl fluorides may also be used. Different surfactants may be used in admixture.

The chelating agents usable herein, for instance, are catechol, benzotriazole and diphosphonic acid. In this case, different chelating agents may be used in admixture. The chelating agents may be used in combination with the surface active agents.

For instance, where the corrosion of metals such as Al and Cu is likely to become a problem, the addition of surfactants and chelating agents is effective. Preferably, the amount of the surfactant added should be between 0.002% by mass and 1% by mass and the amount of the chelating agent added should range from 0.01% by mass to 5% by mass.

To enhance the ability of the inventive remover to remove resist residues depending on their type, oxidizing agents and reducing agents may optionally be contained therein. The oxidizing agents, for instance, include hydrogen peroxide whereas the reducing agents, for instance, include ascorbic acid and cysteine. Preferably, the amount of the oxidizing agent used should be between 0.5% by mass and 5.5% by mass and the amount of the reducing agent used should range from 1% by mass to 10% by mass.

The resist treated according to the present invention may be of either the negative type or the positive type. However, it is particularly preferable that the positive type novolak resin resist is treated.

When resist residues are removed in the semiconductor and liquid crystal fields, impurities, especially iron, sodium and potassium have some influences on device characteristics. Depending on what field the remover of the present invention is applied to, it is possible to reduce the impurity content of the remover to a certain prescribed level or below. For instance, the remover of the invention may be rid of impurities by electrodialysis.

According to the present invention, resist residues are removed from the member to be treated by bringing then in contact with each other. For this contact, for instance, the remover may be sprayed onto the desired portion of the member to be treated. However, it is preferable to immerse or dip the member to be treated in a treating tank full of the remover of the invention. In such a treating tank, it is preferable to effect stirring or rocking.

The temperature and time of contact of the member with the remover are 23° C. to 90° C. and about 1 minute to 60 minutes, respectively, although varying with the pH of the remover, the properties and material of the member to be treated, etc. Thus, only a short time is needed at a relatively low temperature.

To keep a given constant effect on resist residual removal, one batch of treating solution may be replaced by another batch of treating solution when the treating tank is operated in a batch fashion. Alternatively, when the treating tank is operated in a continuous fashion, a fresh (replenishing) solution is supplied to compensate for evaporation. It is here noted that the tank used herein may have a volume of the order of 20 to 300 liters.

Once the member has been treated with the remover of the present invention, it is preferable to wash the member with water, followed by drying. Thus, the post-removal treatment involves only a water washing step.

EXAMPLE

The present invention is now explained more illustratively with reference to some examples which were provided solely for purposes of illustration and are not intended to be limitative.

Example 1

PREPARATION OF REMOVER

Ammonium orthophosphate was used as the phosphoric acid compound. The ammonium orthophosphate was then diluted with water, optionally with the addition of orthophosphoric acid and ammonia, to prepare an aqueous solution containing the ammonium orthophosphate at a phosphorus concentration of 1.0% by mass and having such pH values as shown in Table 1.

For the ammonium orthophosphate a guaranteed commercial product represented by a chemical formula: $(NH_4)_3PO_4$ was used and for the orthophosphoric acid a product of the electronic industry grade (an 85% by mass aqueous solution) was used. For the water deionized water was used.

SUBSTRATE A TO BE TREATED

A multilayered Si/Ti/TiN/Al/TiN substrate of 8 inches in diameter and 700 μm in thickness was patterned using a positive type novolak resin photoresist, and then treated by plasma etching. For the etching gas, gases based on chlorine and fluorine were used. After etching, the photoresist was removed by oxygen plasma ashing. The resultant multilayered substrate is called substrate A.

REMOVAL

The multilayered substrate (substrate A) was treated at 35° C. using the aforesaid remover, and then washed with water. The removal treatment was carried out for the times shown in Table 1.

In this case, a lidded tank of 20 liters in volume was filled with the remover. Water washing was carried out at 25° C. for 5 minutes in a tank having the same capacity and filled with purified water.

The thus treated multilayered substrate was estimated in terms of how much resist residues were removed and to what degree the metals were corroded. The results are shown in Table 1. For estimation of how much resist residues were removed, the sides of interconnecting wires on a wide space and the upper sides of interconnecting wires with a space/line of 0.25 μm/0.25 μm were estimated by scanning electron microscope (SEM) photographs. In Table 1, the circle mark (O) indicates complete removal of resist residues, the triangle mark (Δ) indicates that resist residues were removed to a somewhat imperfect yet practically acceptable level, and the cross mark (X) indicates that resist residual were removed on an imperfect or practically unacceptable level. The corrosion of the metals was estimated with regard to Al. The circle mark indicates that the corrosion of the metal was not observed at all, the triangle mark indicates that the corrosion of the metal was slightly observed yet on a practically acceptable level, and the cross mark indicates that the metal was corroded to a practically unacceptable level.

TABLE 1

Ammonium Orthophosphate Composition (35° C.)

| Remover | | 5 min. | | 10 min. | | 15 min. | | 20 min. | |
|---|---|---|---|---|---|---|---|---|---|
| No. | pH | Removal | Corrosion | Removal | Corrosion | Removal | Corrosion | Removal | Corrosion |
| 1 | 2.5 | O | O | O | Δ | O | X | O | X |
| 2 | 4.5 | O | O | O | O | O | Δ | O | Δ |
| 3 | 7.0 | Δ | O | Δ | O | O | O | O | O |
| 4 | 9.0 | X | O | X | O | Δ | Δ | Δ | X |

From Table 1, it is found that by the selection of the treating condition, resist residue removal can be carried out with no corrosion of the metal over a wide pH region. It is also found that the acceptable range of the treating condition may become wide although depending the pH of the remover.

Example 2

Ammonium pyrophosphate, condensed ammonium phosphate comprising ammonium pyrophosphate and orthophosphoric acid were used to prepare remover No. 21 having a phosphoric acid concentration and pH regulated to 1.0% by mass and 2.5, respectively, by use of water (ion exchanged water). The pyrophosphoric acid and tripolyphosphoric acid concentrations of this remover were 0.27% by mass and 0.07% by mass, respectively.

Using this remover No. 21 (pH 2.5), the same removal and estimation as in Example 1 were carried out with the exception that the treating condition was changed as shown in Table 2. The results are shown in table 2.

TABLE 2

Condensed ammonium phosphate composition (pH 2.5)

| Treating Temperature (° C.) | Treating Time | | | | | | | | | |
|---|---|---|---|---|---|---|---|---|---|---|
| | 1 min. | | 5 min. | | 10 min. | | 15 min. | | 20 min. | |
| | Removal | Corrosion | Removal | Corrosion | Removal | Corrosion | Removal | Corrosion | Removal | Corrosion |
| 30 | X | ○ | Δ | ○ | Δ | ○ | Δ | ○ | ○ | ○ |
| 35 | X | ○ | ○ | ○ | ○ | ○ | ○ | ○ | ○ | ○ |
| 40 | X | ○ | ○ | ○ | ○ | ○ | ○ | ○ | ○ | Δ |
| 45 | Δ | ○ | ○ | Δ | ○ | Δ | ○ | Δ | ○ | Δ |
| 50 | ○ | ○ | ○ | Δ | ○ | Δ | ○ | Δ | ○ | X |
| 55 | ○ | ○ | ○ | X | ○ | X | ○ | X | ○ | X |

It is found that by the selection of the treating condition, resist residual removal can be carried out with no corrosion of the metal.

Example 3

In the ammonium orthophosphate-containing remover of Example 1 and the condensed ammonium phosphate-containing remover of Example 2, pH regulations were carried out using ammonia and orthophosphoric acid to examine the pH-dependent amount of aluminum dissolved in each remover system.

DETECTION OF THE AMOUNT OF DISSOLVED ALUMINUM

A (10 mm long, 10 mm broad, 1 mm thick) aluminum plate was immersed in each remover system at 45° C. for 3 hours to find the amount (μg/liter) of Al dissolved therein by atomic absorption spectrometry.

The results are plotted in FIG. 1.

From FIG. 1, it is seen that the dependence of Al dissolution on pH is more reduced in the condensed ammonium phosphate-containing system than in the ammonium orthophosphate-containing system.

Example 4

PREPARATION OF REMOVER

At varied pH a remover was prepared as in Example 1 with the exception that the phosphorus concentration was changed to 6% by mass.

SUBSTRATE B TO BE TREATED

A multilayered Si/Cu/SiN/p-TEOS (SiO$_2$)/FSG/SiON substrate of 8 inches in diameter and 700 μm in thickness was patterned using a positive type novolak resin photoresist, and then treated by plasma etching. For the etching gas, gases based on chlorine and fluorine were used.

After etching, the photoresist was removed by oxygen plasma ashing. The resultant multilayered substrate is called substrate B.

It is here noted that p-TEOS(SiO$_2$) represents a film wherein p-tetraethoxysilane was converted to SiO$_2$ by plasma treatment, and FSG stands for silicate fluoride glass.

REMOVAL

Resist residue removal was carried out as in Example 1 with the exception that the treating temperature was changed between 55° C. and 75° C. and the treating time was 15 minutes.

Estimation was made as in Example 1, and the results are shown in Table 3.

TABLE 3

Ammonium Orthophosphate Composition (15 min.)

| | Treating Temperature (° C.) | | | | | | | |
|---|---|---|---|---|---|---|---|---|
| | 55 | | 60 | | 70 | | 75 | |
| pH | Removal | Corrosion | Removal | Corrosion | Removal | Corrosion | Removal | Corrosion |
| 7 | X | ○ | X | ○ | ○ | ○ | ○ | X |
| 8 | X | ○ | ○ | ○ | ○ | ○ | ○ | X |

From Table 3, it is found that by the selection of the remover composition and treating condition, resist residues from a copper layer-containing film such as substrate B can be removed with no corrosion of copper.

Example 5

PREPARATION OF REMOVER

At varied pH a remover was prepared as in Example 1 with the exception that the phosphorus concentration was changed to 1.5% by mass.

SUBSTRATE C TO BE TREATED

A multilayered Si/SiO$_2$/poly-Si/WN/W/SiN substrate of 8 inches in diameter and 700 μm in thickness was patterned using a positive type novolak resin photoresist, and then treated by plasma etching. For the etching gas, gases based on chlorine and fluorine were used.

After etching, the photoresist was removed by oxygen plasma ashing. The resultant multilayered substrate is called substrate C.

REMOVAL

Resist residue removal was carried out as in Example 1 with the exception that the treating temperature was changed between 45° C. and 75° C. and the treating time was 15 minutes.

Estimation was made as in Example 1, and the results are shown in Table 4.

TABLE 4

| | Ammonium Orthophosphate Composition (15 min.) | | | | | | | |
|---|---|---|---|---|---|---|---|---|
| | Treating Temperature (° C.) | | | | | | | |
| | 45 | | 55 | | 65 | | 75 | |
| pH | Removal | Corrosion | Removal | Corrosion | Removal | Corrosion | Removal | Corrosion |
| 5.7 | X | ○ | Δ | ○ | ○ | ○ | ○ | ○ |
| 6.4 | X | ○ | ○ | ○ | ○ | ○ | ○ | ○ |
| 7.1 | ○ | ○ | ○ | ○ | ○ | ○ | ○ | X |
| 8   | ○ | ○ | ○ | ○ | ○ | X | ○ | X |

From the results of Table 4, it is found that by the selection of the remover composition and treating condition, resist residues from a film containing a metal such as tungsten can be removed. It is also found that in the treating conditions where resist residues can be removed, there is a specific condition that no corrosion of tungsten occurs.

Example 6

PREPARATION OF REMOVER

At varied pH a remover was prepared as in Example 1 with the exception that the phosphorus concentration was changed to 1.5% by mass.

SUBSTRATE D TO BE TREATED

A multilayered Si/SiO$_2$ (with an SiO$_2$ thickness of 2 to 5 nm) substrate of 8 inches in diameter and 700 μm in thickness was patterned using a positive type novolak resin photoresist, and As ions were then implanted thereinto at a dose of 5×10$^{15}$ atoms/cm$^2$ (this dose is the amount of ions implanted and represented by the number of atoms per cm$^2$). After ion implantation, the photoresist was removed by oxygen plasma ashing. The resulting multilayered substrate is called substrate D.

REMOVAL

Resist residue removal was carried out as in Example 1 with the exception that the treating temperature was changed between 55° C. and 85° C. and the treating time was 15 minutes.

Estimation was made as in Example 1, and the results are shown in Table 5.

TABLE 5

| | Ammonium Orthophosphate Composition (15 min.) | | | | | | | |
|---|---|---|---|---|---|---|---|---|
| | Treating Temp. (° C.) | | | | | | | |
| | 55 | | 65 | | 75 | | 85 | |
| pH | Removal | Corrosion | Removal | Corrosion | Removal | Corrosion | Removal | Corrosion |
| 5 | X | ○ | ○ | ○ | ○ | ○ | ○ | ○ |
| 6 | X | ○ | ○ | ○ | ○ | ○ | ○ | X |
| 7 | ○ | ○ | ○ | Δ | ○ | X | ○ | X |
| 8 | ○ | ○ | ○ | X | ○ | X | ○ | X |

From the results of Table 5, it is found that by the selection of the composition and removal condition, it is possible to remove the resist residues with ions implanted into them with no corrosion of the insulating film.

Example 7

Remover Nos. 22, 23 and 24 were prepared by adding to condensed ammonium phosphate-containing remover No. 21 of Example 2 100 ppm of a cationic surfactant A based on perfluoroalkyltrimethyl ammonium salt, 100 ppm of an amphoteric surfactant B based on perfluoroalkylbetaine and 100 ppm of a nonionic surfactant C based on perfluoroalkylamine oxide, respectively.

As in Example 3, aluminum was immersed in each of systems comprising remover Nos. 21 to 24 at 35° C., 45° C. or 55° C. for 60 minutes to examine the amount in ppm of Al dissolved therein. The results are shown in Table 6.

TABLE 6

(pH2.5, 60 min.)

| Remover No. | Surfactant or Chelating Agent | Amount of Dissolved Al in ppm (Treating Temperature) | | |
|---|---|---|---|---|
| | | 35° C. | 45° C. | 55° C. |
| 21 | None | 8.94 | 20.92 | 42.08 |
| 22 | A (cationic) | 3.48 | 4.38 | 15.21 |
| 23 | B (amphoteric) | 2.30 | 4.25 | 10.98 |
| 24 | C (nonionic) | 2.90 | 3.83 | 16.35 |
| 25 | D (chelating agent) | 3.30 | 4.15 | 12.10 |

It is found that by the addition of the surfactant it is possible to reduce the amount of dissolved aluminum considerably.

The amount of aluminum dissolved in a system comprising remover No. 25 containing 2% by mass of a phosphonic acid chelating agent D instead of the aforesaid surfactant is also shown in Table 6. The addition of the chelating agent, too, made it possible to reduce the amount of dissolved aluminum.

Example 8

Even with the removers of Examples 1 and 2 with 5% by mass of hydrogen peroxide added thereto, it is found that their ability to remove resist residues can be enhanced. The same also holds for systems with various surfactants or chelating agents added thereto as in Example 7.

EFFECT OF THE INVENTION

According to the present invention, removal of resist residues can be carried out without corrosion or other problems and with great safety.

What is claimed is:

1. An aqueous composition, which comprises
    (a) ammonium phosphate, condensed ammonium phosphate or both,
    (b) an anionic surfactant, wherein said anionic surfactant is an alkyl carboxylate surfactant, and
    (c) at least one pH-adjusting compound selected from the group consisting of phosphoric acid, condensed phosphoric acid and ammonia;
        wherein said aqueous composition has a pH ranging from 1 to 10.

2. The aqueous composition of claim 1, wherein said ammonium phosphate or said condensed ammonium phosphate or both have a concentration of 20% by mass or less as expressed in terms of total phosphorus concentration.

3. The aqueous composition of claim 1, which further comprises a surface active agent or chelating agent or both.

4. The aqueous composition of claim 1, wherein said at least one pH-adjusting compound is phosphoric acid, which is orthophosphoric acid.

5. The aqueous of claim 3, wherein said surface active agent is a nonionic surfactant.

6. The aqueous composition of claim 5, wherein said nonionic surfactant is polyoxyethylene or an amine oxide surfactant.

7. The aqueous composition of claim 3, wherein said surface active agent is a cationic surfactant.

8. The aqueous composition of claim 7, wherein said cationic surfactant is an alkyltrimethyl ammonium salt surfactant.

9. The aqueous composition of claim 3, wherein said surface active agent is an amphoteric surfactant.

10. The aqueous composition of claim 9, wherein said amphoteric surfactant is a betaine surfactant.

11. The aqueous composition of claim 3, wherein said surface active agent is used in an amount of between 0.002 and 1% by mass.

12. The aqueous composition of claim 3, wherein said chelating agent is used in an amount of between 0.01 to 5% by mass.

13. The aqueous composition of claim 1, which further comprises an oxidizing agent.

14. The aqueous composition of claim 1, which further comprises a reducing agent.

15. A method of removing resist residues from a semiconductor device or liquid crystal device from a fabrication process therefor, which comprises the steps of:
    a) contacting said semiconductor device or liquid crystal device with the aqueous composition of claim 1; and
    b) washing said contacted semiconductor device or liquid crystal device, thereby removing said resist residues.

16. The method of claim 15, wherein said washing is effected with water.

17. The aqueous of claim 1, wherein said condensed ammonium phosphate contains ammonium polyphosphate of the formula $(NH_4P_nO_{3n+1})$ having a polymerization degree such that n=2, 3, 4 or 5, or ammonium metaphosphate of the formula $(NH_4PO_3)_n$ having a polymerization degree such that n=3, 4 or 5; or both.

18. A method of removing residue from a resist, which comprises contacting said resist with the aqueous composition according to claim 1.

19. The aqueous composition according to claim 1, wherein said pH is adjusted with ammonia.

20. The method of claim 18, wherein said contacting is effected by spraying said aqueous composition onto said resist.

21. The method of claim 18, wherein said contacting is effected by immersing said resist into said aqueous composition.

22. The method of claim 18, wherein said contacting is effected at a temperature of from about 23 to 90° C. for about 1 to 60 minutes.

23. The method of claim 18, wherein said resist is a negative resist.

24. The method of claim 23, wherein said resist is a positive resist and is a novolac resin resist.

25. The method of claim 18, wherein said residue comprises iron-, sodium- or potassium-containing impurities.

26. The aqueous composition according to claim 1, which comprises condensed ammonium phosphate.

27. The aqueous composition according to claim 3, wherein said chelating agent is one or more chelating agents selected from the group consisting of catechol, benzotriazole, and diphosphonic acid.

* * * * *